US006479761B1

(12) United States Patent
Paquette

(10) Patent No.: US 6,479,761 B1

(45) Date of Patent: Nov. 12, 2002

(54) CIRCUIT BOARD WITH REDUCED NOISE ARCHITECTURE

(75) Inventor: Louis A. Paquette, Westford, MA (US)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 09/362,515

(22) Filed: Jul. 28, 1999

(51) Int. Cl.[7] ................................................ H01R 9/09

(52) U.S. Cl. ....................... 174/261; 174/262; 174/263; 333/161

(58) Field of Search ................................ 174/255, 201, 174/202, 203; 333/161; 361/772, 773

(56) References Cited

U.S. PATENT DOCUMENTS 4,783,359 A * 11/1988 Fleischer et al. ........... 174/255

5,165,166 A * 11/1992 Carey ......................... 174/261

5,430,247 A * 7/1995 Bockelman ................. 174/261

5,571,996 A * 11/1996 Swamy et al. .............. 174/261

6,175,727 B1 * 1/2001 Mostov ...................... 174/255

* cited by examiner

*Primary Examiner*—Albert W. Paladini
(74) *Attorney, Agent, or Firm*—John C. Gorecki

(57) ABSTRACT

A multilayer circuit board includes a set of conductors that are coupled with ground to remove undesired high frequency noise. To that end, the multilayer circuit board includes a first layer having a circuit trace in the form of a serpentine, a ground layer set to a reference potential, and the set of conductors noted above. Each of the conductors extends from the first layer to the ground layer from within an interior portion of the serpentine. The set of conductors electrically contact the ground layer.

39 Claims, 4 Drawing Sheets

CIRCUIT BOARD WITH REDUCED NOISE ARCHITECTURE

FIELD OF THE INVENTION

The invention generally relates to circuit boards and, more particularly, the invention relates to reducing high frequency noise produced by data signals transmitted through circuit traces on a circuit board.

BACKGROUND OF THE INVENTION

Circuit boards commonly are constructed with multiple layers that each have a specific function. For example, one layer may be utilized for powering electronics, another for high speed memory circuitry (e.g., memory that operates between about 66 and 300 megahertz), and another for grounding purposes. Each of these layers typically is separated by an insulator, such as fiberglass, to prevent undesired electrical coupling between the adjacent layers. When necessary, inter-layer conductors, known in the art as "vias", can be utilized to electrically couple circuit elements on one layer with circuit elements on other layers.

Since high speed memory circuitry operates synchronously (i.e., at specific frequencies), data signals transmitted on a high speed memory layer commonly emit high frequency noise. Undesirably, high frequency noise often shunts to ground through other circuits that are located in a relatively close proximity to such circuitry (e.g., circuits on an adjacent layer). Receipt of such noise consequently can corrupt signals transmitted by circuits receiving the noise, thus degrading the operation of the entire circuit board.

SUMMARY OF THE INVENTION

In accordance with one aspect of the invention, a multilayer circuit board includes a set of conductors that are coupled with ground to remove undesired high frequency noise. To that end, the multilayer circuit board includes a first layer having a circuit trace in the form of a serpentine, a ground layer set to a reference potential, and the set of conductors noted above. Each of the conductors extends from the first layer to the ground layer from within an interior portion of the serpentine. The set of conductors electrically contact the ground layer.

In preferred embodiments, the reference potential is zero volts, such as a ground potential. The set of conductors may be arranged to form a bandpass filter that filters signals transmitted at a prescribed frequency through the serpentine. The bandpass filter has a minimum and maximum frequency, where the minimum frequency is greater than the prescribed frequency. In preferred embodiments, the minimum frequency is a harmonic of the prescribed frequency.

The first layer and ground layer may be substantially parallel. The circuit board also may include a second layer that also is set to the reference potential. The first layer thus is positioned between the second layer and the ground layer. In such embodiment, each conductor in the set of conductors has a ground end coupled with the ground layer, and a second layer end electrically coupled with the second layer. The circuit board may include other electronic modules, such as a modem. The interior of the serpentine is bounded by the circuit trace and may include an insulator. An insulator may be positioned between the first layer and the ground layer.

In accordance with another aspect of the invention, a multilayer circuit board includes a first layer having a circuit trace forming a serpentine that defines an interior bounded by the circuit trace, a ground layer set to a reference potential, and a set of conductors extending from the interior of the serpentine to the ground layer. The circuit trace includes an input for receiving a signal that is transmitted at a prescribed frequency. The set of conductors is arranged to remove noise from the signal transmitted through the circuit trace. The noise that is removed has a frequency that is greater than the prescribed frequency of the signal.

The set of conductors preferably are arranged to form a bandpass filter for filtering noise from the signal. The bandpass filter has a minimum frequency that is greater than the prescribed frequency. The minimum frequency preferably is a harmonic of the prescribed frequency.

In accordance with other aspects of the invention, a method of manufacturing a multilayer circuit board couples a ground layer to a first layer, sets the ground layer to a grounding reference potential, and forms a circuit trace on the first layer in the form of a serpentine having an interior. The method also extends a set of conductors from the interior of the serpentine, and electrically couples them with the ground layer.

In preferred embodiments, an insulator is coupled between the ground layer and the first layer. The set of conductors may be spaced within the interior of the serpentine to form a bandpass filter that filters data signals transmitted through the circuit trace.

BRIEF DESCRIPTION OF THE DRAWINGS

The foregoing and other objects and advantages of the invention will be appreciated more fully from the following further description thereof with reference to the accompanying drawings wherein.

DESCRIPTION OF PREFERRED EMBODIMENTS

Figure 1:
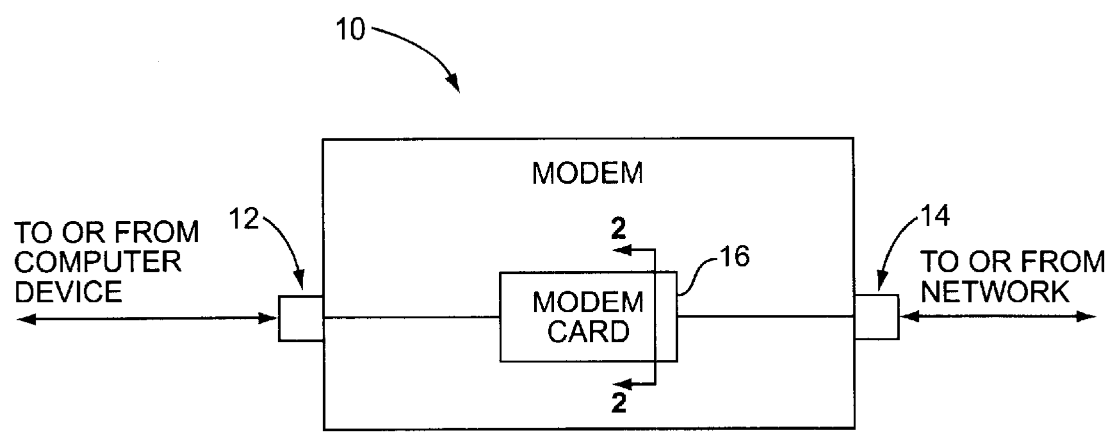
FIG. 1 schematically shows a plan view of a modem having a computer card configured in accordance with preferred embodiments of the invention.

FIG. 1 schematically shows a plan view of a modem 10 that has a computer card configured in accordance with preferred embodiments of the invention. Specifically, the modem 10 includes a first port 12 coupled with a computer device (not shown), a second port 14 coupled with a network (not shown), and a modem card 16 that preferably is configured to minimize coupling of signal harmonics. For example, the modem 10 may be a CVX 1800™ modem (available from Nortel Networks Corporation of Brampton, Ontario) that is specially configured in the manner described herein. Of course, either or both of the two ports may be coupled to any computer device and/or network line as desired and thus, their being respectively coupled to a computer device and a network in FIG. 1 should not suggest that the modem 10 is limited to those connections.

Figure 2:
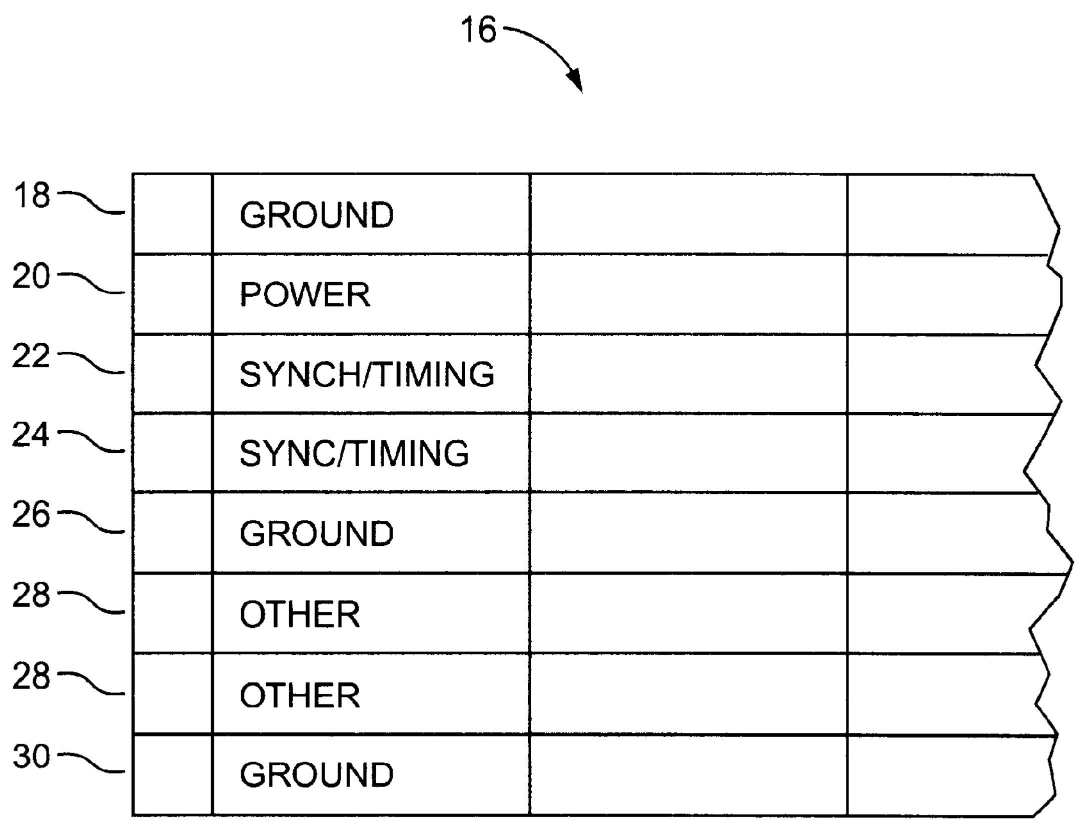
FIG. 2 schematically shows a cross-sectional view of a preferred modem card shown in FIG. 1.

In preferred embodiments, the modem card 16 is a multilayer computer card. Specifically, FIG. 2 schematically shows a cross-sectional view of the modem card 16 shown in FIG. 1 along line 2—2. The modem card 16 thus includes a top ground layer 18, a power layer 20 for providing power to the card, a first synchronous layer 22 and a second synchronous layer 24 for supporting circuit elements having timing requirements, an internal grounding layer 26, two other layers 28 for other (non-synchronous) circuit elements (e.g., interrupt modules, slew rate signals, various sensors, and other non-synchronous devices), and a bottom ground layer 30. Each layer preferably comprises a substrate of insulating material, such as fiberglass, for supporting various circuit elements. For example, the synchronous layers 22 and 24 preferably include a fiberglass substrate with high speed memory modules that communicate by means of circuit traces. In preferred embodiments, the memory modules are conventional 64 megabyte synchronous dynamic random access memory modules ("SDRAM") having an operating frequency of about 66 megahertz.

In addition to circuit elements and the various layers, the modem card 16 further includes a set of conductors 40 (shown in FIG. 3, discussed below) known in the art as "vias" ("vias 40") that extend from the top ground layer 18 to the bottom ground layer 30. The set of conductors are positioned through the layers so that they attenuate high frequency noise produced by the traces and circuit elements in the synchronous layers 22 and 24. This attenuation favorably reduces interference with other circuit elements that can be produced by such noise.

Figure 3:
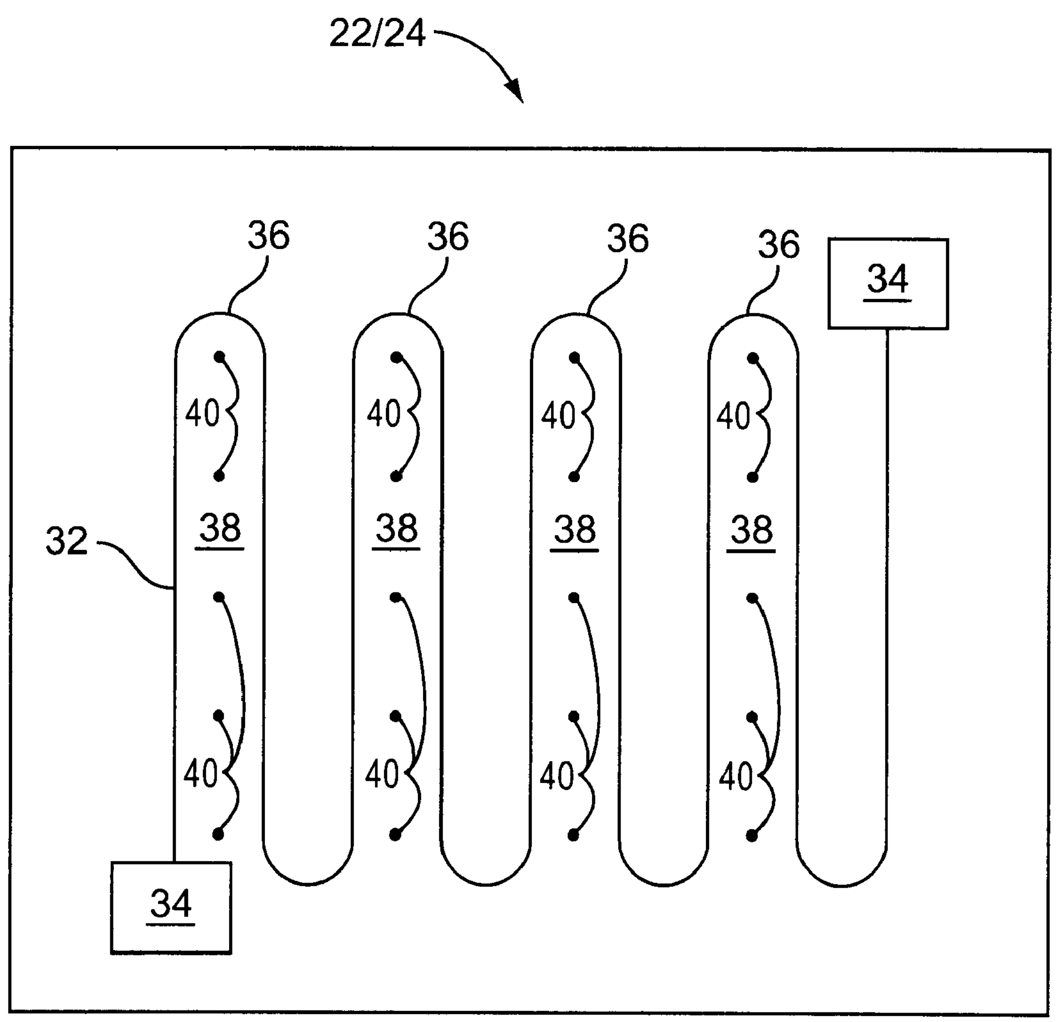
FIG. 3 schematically shows a plan view of a synchronous layer of the modem card shown in FIG. 2.

FIG. 3 schematically shows a plan view of one of the synchronous layers 22/24 of the modem card 16. The shown synchronous layer 22/24 includes a circuit trace 32 electrically connecting two circuit elements 34 (e.g., high speed memory). As is common in the art, the trace 32 is configured into a plurality of serpentines 36 due to timing requirements of the connected circuit elements 34. Such trace 32 therefore is considered to be a delay line that complies with timing requirements of the connected circuit elements 34. In accord with preferred embodiments of the invention, however, each serpentine 36 includes an interior 38 portion that contains a plurality of equally spaced vias 40. Since insulators separate the vias 40 from the serpentines 36, none of the vias 40 directly electrically contact any of the serpentines 36. Each via 40, however, is in direct electrical contact with both the top and bottom ground layers 18 and 30 and thus, extends through the entire modem card 16. As shown, vias 40 are positioned within the interior 38 of every other serpentine 36 (i.e., those with a rounded top portions in the figures) since a significant amount of interference produced by harmonics of each serpentine 36 is shunted to ground through the vias 40 in their interior 38 and not through the adjacent serpentines 36. In other embodiments, additional vias 40 are positioned between the rounded top serpentines 36. In yet other embodiments, vias 40 are positioned in the interior 38 of the serpentines 36 having the open top portions.

In alternative embodiments, microvias (not shown) are utilized to extend from the interior 38 of the serpentines 36 to the internal ground layer 26 only. As known in the art, a microvia is a type of via that does not extend across all board layers. Instead, a microvia extends across less than all the layers. For example, a microvia may have a top end that terminates on a given synchronous layer 22 or 24 in the interior 38 of a given serpentine 36, and another end that terminates at the internal grounding layer 26. Such vias 40 therefore do not extend to the top and bottom ground layers 18 and 30.

When spaced in accordance with equation 1 below, high frequency harmonics of the operating frequency should shunt to ground through the vias 40 and not through electronic elements in another layer of the modem card 16. This improves system performance by reducing interference produced by the harmonics created by the synchronous layer elements and traces.

As noted above, the vias 40 preferably are arranged to form a band pass filter that attenuates high frequency harmonics produced by the electronic elements and traces 32 while operating at the desired operating frequency. Satisfactory results are expected at high frequency harmonics ranging from 100 megahertz to 700 megahertz. It is anticipated, however, that preferred embodiments may satisfactorily attenuate high frequency harmonics as high as 1,000 megahertz (i.e., 1 gigahertz).

Equation 1 below is an equation that may be utilized in preferred embodiments to predict the attenuation of vias 40 within a given serpentine 36:

$$Sn=(20\log(\text{light speed}/2*\text{length of segment}*fn))-10\log(\text{number of segments}) \quad \text{Equation 1}$$

where:

Sn is the attenuation produced by the filter at the given frequency;

light speed is 300,000,000 meters per second;

length of segment is the distance between each via 40;

fn is the frequency of the harmonics being attenuated; and number of segments is the total number of segments of insulators between each via 40 (i.e., one less than the total number of vias 40)

Figure 4:
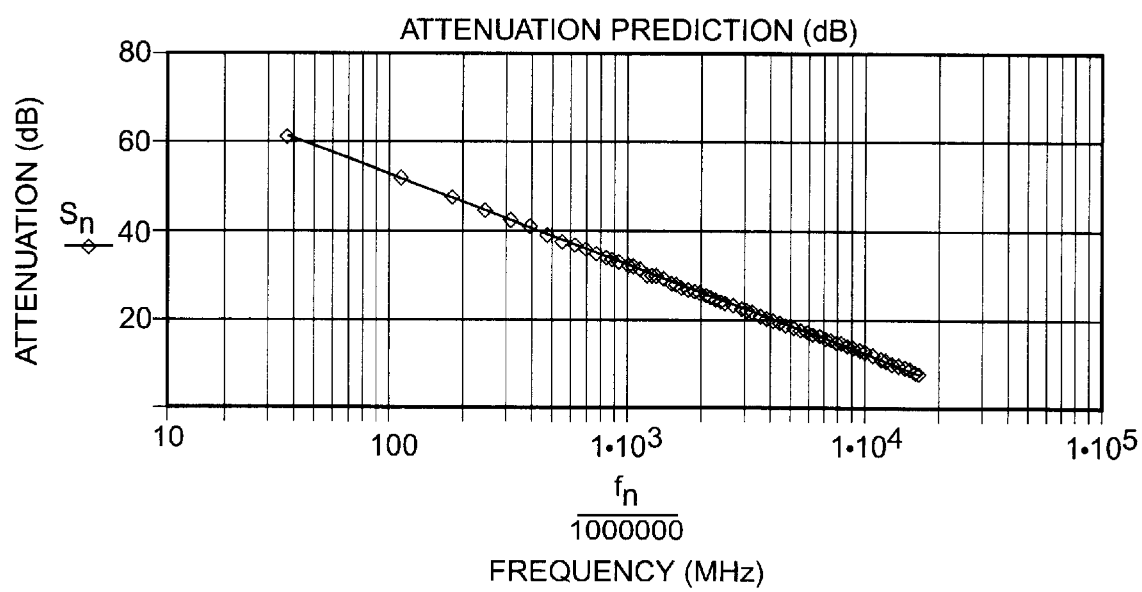
FIG. 4 graphically shows the attenuation produced by a preferred filter utilized with the modem card shown in FIGS. 1 and 2.

FIG. 4 graphically shows the predicted attenuation produced by the vias 40 as a function of harmonics frequency for a given serpentine 36 that complies with equation 1. In this graph, the parameters for the given serpentine 36 and accompanying vias 40 are as follows:

number of vias 40: five;

number of segments: four; and length of segments: 2/1000 meters (i.e., two millimeters).

Accordingly, the vias 40 may be spaced according to the amount of attenuation desired. During testing, five vias 40 were linearly inserted two millimeters apart within the interior 38 of a test serpentine 36. Such vias 40 produced a ten to fifteen decibel reduction in coupling 51 megahertz harmonics from HSSI circuitry (high speed serial interface) to 100 BaseT circuitry. In addition to reducing undesired harmonics interference (e.g., common mode coupling) with other circuit elements, it also has been found that adjacent serpentines 36 can be spaced closer to one another with a minimum of crosstalk/signal integrity problems. Of course, this enables additional board space on the modem card 16 to be used to support additional electronic elements.

Existing modem cards and new modem cards may be manufactured in accord with preferred embodiments by drilling a hole through the card, and securing vias 40 in the holes. Of course, the holes are positioned in accordance with equation 1 above.

It should be noted that modem cards were discussed for exemplary purposes. Preferred embodiments of the invention may be applied to other types of computer cards, such as graphics cards and audio cards. Accordingly, discussion of modem cards is not intended to limit any embodiments of the invention. Moreover, principles of preferred embodiments may be applied to single layer cards and circuit boards having serpentines 36.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

I claim:

1. A multilayer circuit board comprising:

a first layer having a circuit trace in the form of a serpentine, the serpentine having an interior;

a ground layer that is set to a reference potential; and a set of conductors extending from the first layer to the ground layer, each conductor in the set of conductors extending from within the interior of the serpentine to electrically contact the ground layer.

2. The multilayer circuit board as defined by claim 1 wherein the reference potential is zero volts.

3. The multilayer circuit board as defined by claim 1 wherein the reference potential is ground.

4. The multilayer circuit board as defined by claim 1 wherein the set of conductors are arranged to form a bandpass filter for signals transmitted through the serpentine.

5. The multilayer circuit board as defined by claim 4 wherein the bandpass filter has a maximum frequency and a minimum frequency, the serpentine transmitting a signal at a prescribed frequency, the minimum frequency being greater than the prescribed frequency.

6. The multilayer circuit board as defined by claim 5 wherein the minimum frequency is a harmonic of the prescribed frequency.

7. The multilayer circuit board as defined by claim 1 wherein the first layer and ground layer are substantially parallel.

8. The multilayer circuit board as defined by claim 1 further comprising:

a second layer also set to the reference potential, the first layer being between the second layer and the ground layer, each conductor in the set of conductors having a ground end electrically coupled with the ground layer, and a second layer end electrically coupled with the second layer.

9. The multilayer circuit board as defined by claim 1 wherein the circuit board includes a modem.

10. The multilayer circuit board as defined by claim 1 wherein the interior of the serpentine is bounded by the circuit trace and includes an insulator.

11. The multilayer circuit board as defined by claim 1 further comprising an insulator between the first layer and ground layer.

12. A multilayer circuit board comprising:

a first layer having circuit trace forming a serpentine, the serpentine defining an interior that is bounded by the circuit trace, the circuit trace having an input for receiving a signal that is transmitted at a prescribed frequency;

a ground layer that is set to a reference potential; and a set of conductors extending from the interior of the serpentine to the ground layer, the set of conductors being arranged to remove noise from the signal transmitted through the circuit trace, the noise having a frequency that is greater than the prescribed frequency of the signal.

13. The multilayer circuit board as defined by claim 12 wherein the reference potential is zero volts.

14. The multilayer circuit board as defined by claim 12 wherein the reference potential is ground.

15. The multilayer circuit board as defined by claim 12 wherein the set of conductors includes a first conductor having a ground layer end electrically coupled with the ground layer.

16. The multilayer circuit board as defined by claim 12 wherein the set of conductors are arranged to form a bandpass filter for filtering the signal.

17. The multilayer circuit board as defined by claim 16 wherein the bandpass filter has a maximum frequency and a minimum frequency, the minimum frequency being greater than the prescribed frequency.

18. The multilayer circuit board as defined by claim 17 wherein the minimum frequency is a harmonic of the prescribed frequency.

19. The multilayer circuit board as defined by claim 12 wherein the first layer and ground layer are substantially parallel.

20. The multilayer circuit board as defined by claim 12 further comprising:

a second layer also set to the reference potential, the first layer being between the second layer and the ground layer, each conductor in the set of conductors having a ground end coupled with the ground layer, and a second layer end coupled with the second layer.

21. The multilayer circuit board as defined by claim 12 wherein the interior of the serpentine includes an insulator.

22. The multilayer circuit board as defined by claim 12 wherein the circuit board includes a modem.

23. A multilayer circuit board comprising:

a first layer having a circuit trace in the form of a serpentine, the serpentine having an interior;

a ground layer that is set to a reference potential; and means for removing noise from data signals that are transmitted through the circuit trace, the noise removing means extending from the interior of the serpentine and being electrically coupled with the ground layer.

24. The multilayer circuit board as defined by claim 23 wherein the reference potential is zero volts.

25. The multilayer circuit board as defined by claim 23 wherein the reference potential is ground.

26. The multilayer circuit board as defined by claim 23 wherein the noise removing means includes a bandpass filter for the data signals transmitted through the serpentine.

27. The multilayer circuit board as defined by claim 26 wherein the bandpass filter has a maximum frequency and a minimum frequency, the serpentine transmitting a signal at a prescribed frequency, the minimum frequency being greater than the prescribed frequency.

28. The multilayer circuit board as defined by claim 27 wherein the minimum frequency is a harmonic of the prescribed frequency.

29. The multilayer circuit board as defined by claim 23 wherein the first layer and ground layer are substantially parallel.

30. The multilayer circuit board as defined by claim 23 further comprising:

a second layer also set to the reference potential, the first layer being between the second layer and the ground layer, each conductor in the set of conductors having a ground end electrically coupled with the ground layer, and a second layer end electrically coupled with the second layer.

31. The multilayer circuit board as defined by claim 23 wherein the circuit board includes a modem.

32. The multilayer circuit board as defined by claim 23 wherein the interior of the serpentine includes an insulator.

33. The multilayer circuit board as defined by claim 23 further comprising an insulator between the first layer and the ground layer.

34. A method of manufacturing a multilayer circuit board, the method comprising:

coupling a ground layer to a first layer;

setting the ground layer to a grounding reference potential;

forming a circuit trace on the first layer, the circuit trace being in the form of a serpentine, the serpentine defining an interior;

extending a set of conductors from the interior of the serpentine; and electrically coupling the set of conductors with the ground layer.

35. The method as defined by claim 34 further comprising:

coupling an insulator between the ground layer and the first layer.

36. The method as defined by claim 34 further comprising:

spacing the set of conductors within the interior of the serpentine to form a bandpass filter that filters data signals transmitted through the circuit trace.

37. A circuit board comprising:

a substrate;

a circuit trace on the substrate, the circuit trace forming a serpentine having an interior; and a set of conductors within the interior of the serpentine, the set of conductors being insulated from the serpentine, the set of conductors being referenced to ground.

38. The circuit board as defined by claim 37 wherein the set of conductors are arranged to form band pass filter for signals transmitted through the serpentine.

39. The circuit board as defined by claim 37 wherein the circuit board includes a plurality of layers that includes a ground layer, the set of conductors being coupled with the ground layer, the substrate being on a different plane than the ground layer.

* * * * *